United States Patent [19]

Douglas

[11] Patent Number: 5,387,497

[45] Date of Patent: Feb. 7, 1995

[54] HIGH RESOLUTION LITHOGRAPHY METHOD USING HYDROGEN DEVELOPING REAGENT

[75] Inventor: Monte A. Douglas, Coppell, Tex.

[73] Assignee: Texas Instruments Incorporated, Dallas, Tex.

[21] Appl. No.: 177,634

[22] Filed: Jan. 4, 1994

Related U.S. Application Data

[63] Continuation of Ser. No. 738,699, Jul. 31, 1991, abandoned.

[51] Int. Cl.⁶ .................................... G03C 5/00
[52] U.S. Cl. ........................... 430/325; 430/326; 430/328
[58] Field of Search ................. 430/325, 326, 328

[56] References Cited

U.S. PATENT DOCUMENTS

| | | | |
|---|---|---|---|
| 3,647,447 | 3/1972 | Gilson et al. | 430/325 X |
| 4,370,404 | 1/1983 | Tachikawa et al. | 430/328 X |
| 4,810,601 | 3/1989 | Allen et al. | 430/325 X |
| 5,015,556 | 5/1991 | Martens | 430/328 X |
| 5,015,559 | 5/1991 | Ogawa | 430/325 X |
| 5,079,131 | 1/1992 | Thackeray et al. | 430/326 |
| 5,094,936 | 3/1992 | Misium et al. | 430/325 |

FOREIGN PATENT DOCUMENTS

| | | |
|---|---|---|
| 0184567 | 6/1986 | European Pat. Off. . |
| 0197286 | 10/1986 | European Pat. Off. . |
| 0204253 | 12/1986 | European Pat. Off. . |
| 0281182 | 9/1988 | European Pat. Off. . |
| 01-284851 | 11/1989 | Japan ......... 430/325 |

OTHER PUBLICATIONS

Baik, et al., "Comparative study between gas-and liquid-phase silylation for the diffusion-enhanced silylated resist process", *Journal of Vacuum Science & Technology*, Part B(6), Nov./Dec. 1991, pp. 3399–3405.

F. Coopmans et al, "DESIRE: A New Route to Submicron Optical Lithography", *Solid State Technology*, Jun. 1987, pp. 93–99.

C. G. Roffey, Photopolymerization of *Surface Coatings*, John Wiley & Sons, New York, N.Y. 1982, pp. 67,126–67,136.

"Laser Development of Latent Images", *IBM Technical Disclosure Bulletin*, pp. 266, vol. 32, No, 7, Dec. 1989.

Pampalone, et al., "Improving Linewidth Control over Reflective Surfaces Using Heavily Dyed Resists", *Journal of the Electrochemical Society*, pp. 192–196, vol. 133, No. 1, Jan. 1986.

Feder, et al., "Dry Development of Photoresists", *IBM Technical Disclosure Bulletin*, p. 316, vol. 19, No. 1, Jun. 1979.

Hartman, et al., "Radiant cured polymer optical waveguides on printed circuit boards for photonic interconnection use", *Applied Optics*, vol. 28, No. 1, pp. 40, 42–47, Jan. 1, 1989.

Brunsvold, et al., "Resist technology for submicrometer optical lithography", *Optical Engineering*, vol. 26, No. 4, pp. 330–336, Apr. 1987.

M. J. Bowden, "Forefront of Research on Resists", *Solid State Technology*, pp. 73–87, Jun. 1981.

Gene E. Fuller, "Optical Lithography Status", *Solid State Technology*, pp. 113–118, Sep. 1987.

Makoto Nakase, "Potential of optical lithography", *Optical Engineering*, vol. 26, No. 4, pp. 319–324, Apr. 1987.

*Primary Examiner*—Roland Martin
*Attorney, Agent, or Firm*—Dana L. Burton; Richard A. Stoltz; James C. Kesterson

[57] ABSTRACT

This is a method for forming patterned features. The method comprises: forming a single layer of resist 12 on a substrate 10, the layer 12 having a thickness; patterning the resist by selective exposure to a first energy source 16 to modify the developing properties of portions of the resist, leaving an amount of the thickness unexposed; and developing the resist. This is also a device which comprises: a substrate; a layer of resist over the substrate; and an energy absorbing dye in the resist. Other methods and structures are also disclosed.

20 Claims, 2 Drawing Sheets

HIGH RESOLUTION LITHOGRAPHY METHOD USING HYDROGEN DEVELOPING REAGENT

This application is a continuation of application Ser. No. 07/738,699, filed Jul. 31, 1991, now abandoned.

FIELD OF THE INVENTION

This invention generally relates to semiconductor devices and in particular for lithography methods.

BACKGROUND OF THE INVENTION

The semiconductor industry is constantly striving to achieve higher density electronic devices. As the industry has moved into micron, submicron and even sub-half-micron sized features to achieve higher densities, the need for improved lithography methods to create such minute features has increased.

Among the problems associated with conventional lithography techniques are the lack of uniformity of exposure of resist through a thick layer of resist and scattered light within the layer of resist due to reflective metallized surfaces under the resist. These problems tend to compound the loss of resolution problem by creating ill-defined patterns at the onset.

Standard methods for image development, in the exposed etch resist, fall short of the requirements for sub-half-micron feature generation. Wet development of the etch resist often produces a positive-grade slope on the feature sidewall that degrades the contrast of image transfer into the underlying thin film during the dry etch process. This is due to the less than infinite etch rate selectivity between the resist and the film material. Thus, there is a need for a method for forming high resolution submicron and sub-half-micron sized features on a semiconductor device.

SUMMARY OF THE INVENTION

This is a method for forming patterned features. The method comprises: forming a single layer of resist on a substrate, the layer having a thickness; patterning the resist by selective exposure to a first energy source to modify the developing properties of portions of the resist, leaving an amount of the thickness unexposed; and developing the resist.

Preferably, the developing is done with a second energy source and a developing reagent; the first and second energy sources are both ultraviolet light; the resist is acrylic-based; a dye is incorporated into the resist to prevent exposure of the amount of the thickness to be left unexposed; the developing reagent includes oxygen or hydrogen; the patterning step occurs in an oxygen-free environment; a nitrogen purge is used to create the oxygen-free environment; and the substrate has multiple layers. A diffusion reagent may be diffused into unmodified regions of the resist before the developing step. The diffusion reagent may contain silicon or may contain titanium.

This is also a device which comprises: a substrate; a layer of resist over the substrate; and an energy absorbing dye in the resist.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Methods to achieve high resolution of a submicron sized feature include increasing the numerical aperture of the imaging tool and/or decreasing the wavelength of light used to expose the etch resist. In both instances, the image depth of field is diminished to less than the dimension of the thickness of the etch mask film and the surface topography. Resultantly, the projected image transfer from the master reticle is unacceptably distorted in various areas of the exposure field.

Methods to overcome these problems, such as multilayer resists, have been proposed. This involves "sensitizing" the surface layer of the etch mask, in some fashion, so the imaging tool only needs to project an accurate image onto the surface of the resist. Hence, the depth of field only needs to be greater than the characteristic surface topography. However, this has not been well-accepted in production environments. Process complexity, particle generation and poor critical dimension control and uniformity have been cited as shortcomings.

A surface-imaging technique, that is compatible with an image development method, is needed to successfully pattern submicron and sub-half-micron features. Surface-imaging is needed to overcome fundamental depth-of-field limitations, associated with the optical imaging tool. The surface-imaging should preferably not be complex or sensitive to small variations in process conditions. A compatible image development technique is needed to ensure the exposure image is faithfully transferred to the remainder of the resist. In turn, this is preferably done in a manner that creates a structure that will faithfully transfer the image into the underlying substrate.

Figure 1:
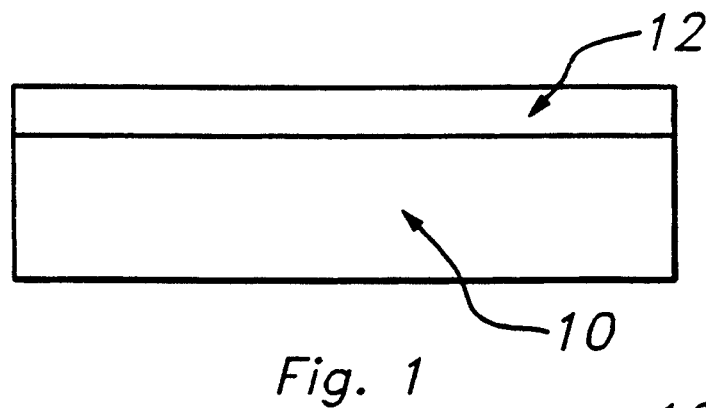
FIG. 1 is a cross-sectional view of forming a resist layer on a substrate.
Figure 2:
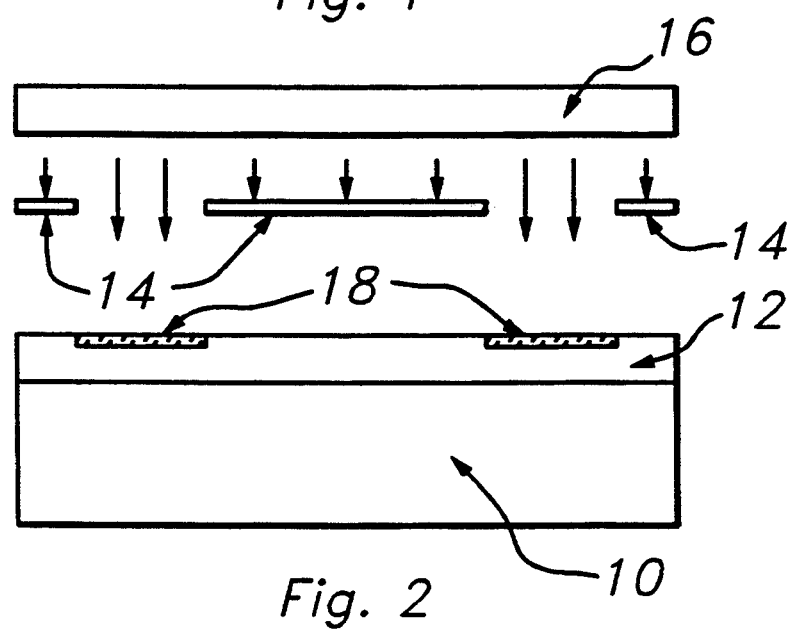
FIG. 2 is a cross-sectional view of formation of crosslinked regions.

Disclosed is a surface-imaging exposure method in conjunction with a dry development method to service submicron and sub-half-micron lithography requirements. A layer of resist 12 is deposited on a substrate 10 that is to be patterned, shown in FIG. 1. The resist 12 does not need to contain a sensitizer, also referred to as a PAC (Photo Active Compound). Referring to FIG. 2, a mask 14 may be used to selectively expose the resist 12 to an energy source 16, such as a deep UV exposure tool, to crosslink the resist 12 on selected regions 18 of the resist 12 surface. The crosslinking is preferably done in an essentially oxygen-free environment. One method which may be used to realize a oxygen-free environment is a nitrogen purge.

Figure 3:
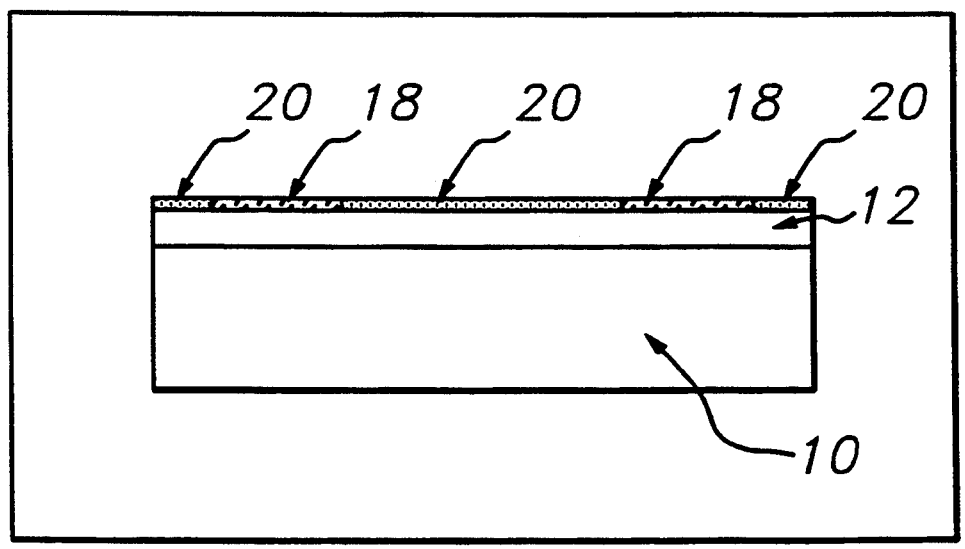
FIG. 3 is a cross-sectional view of reagent exposure in a first preferred embodiment of the present invention.

A first preferred embodiment is shown in FIG. 3. In this embodiment, after crosslinking the resist 12 with the energy source 16, the structure may be exposed to a blanket reagent ambient which diffuses into the regions 20, in the surface of the resist 12, which were not crosslinked. The crosslinked regions 18 serve as diffusion barriers to the reagent. As an example, a silicon containing ambient such as HMDS may be used.

Figure 4:
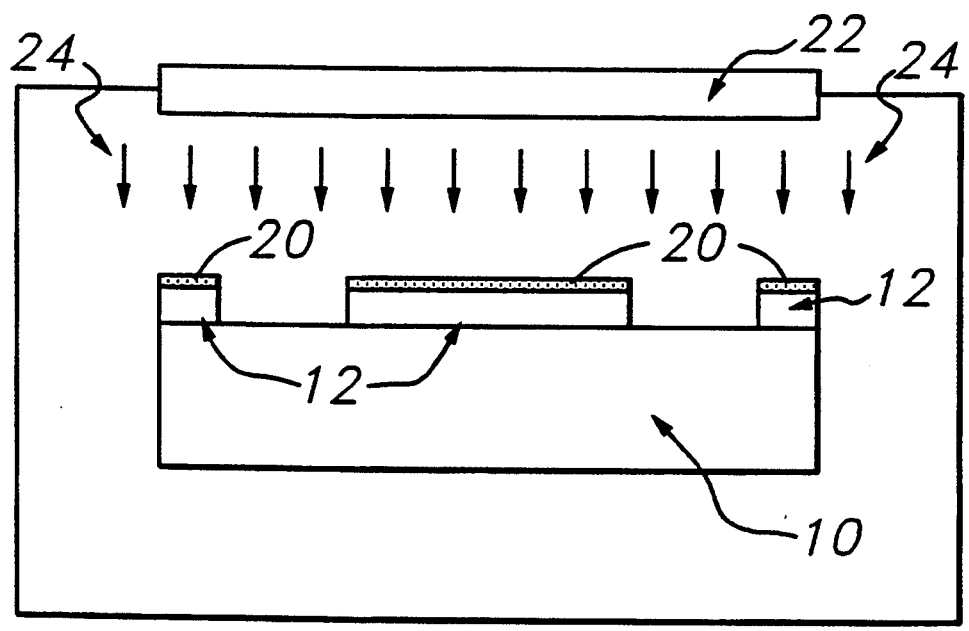
FIG. 4 is a cross-sectional view of patterning a first preferred embodiment of the present invention.

Referring to FIG. 4, the resist 12 is preferably anisotropically dry developed with high contrast by a gentle, photo-assisted etch process (or other "gentle," low-energy etch processes, such as ECR), involving, for example, an oxygen-containing source as a reagent and a light source 22 as an energy source that is capable of disrupting the surface bonding. The diffused regions 20 serve as an etch mask and are minimally affected by the energy source/reagent etch. The "dangling bonds" that are generated by the disruptive light 24 (or other energy source), react with the oxygen-containing reagent (and/or its products), to remove the resist in the regions 18 that are crosslinked. The resultant pattern exhibits a positive tone. Since such low-energy processing may exhibit excellent etch rate selectivity between the crosslinked regions and the uncrosslinked regions, acceptable CD (critical dimension) control and uniformity of the feature may be achieved and vertical sidewalls, for crisp image transfer into the underlying film, may be generated.

Figure 5:
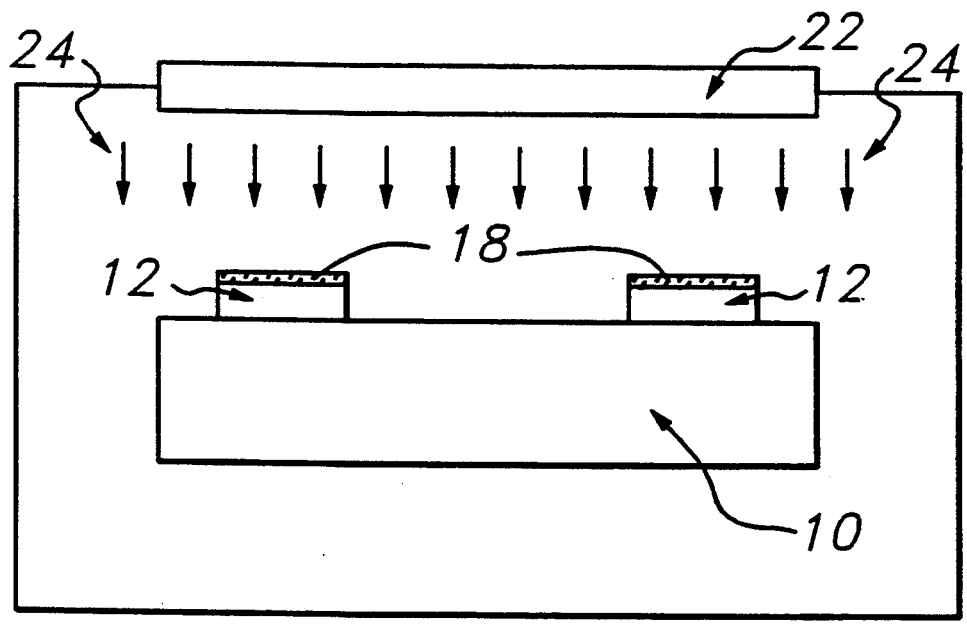
FIG. 5 is a cross-sectional view of patterning a second preferred embodiment of the present invention.

In a second preferred embodiment, the process steps from the first preferred embodiment, described above, shown in FIG. 1 and FIG. 2, are followed to produce crosslinked regions 18 in the surface or the resist 12. In this second preferred embodiment, the structure is not exposed to a diffusion reagent. Instead, the structure goes directly to the develop stage, shown in FIG. 5. The resist 12 is preferably anisotropically dry developed with high contrast by a gentle, photo-assisted etch process (or other "gentle," low-energy etch processes, such as ECR), involving, for example, an oxygen-containing source as a reagent and a light source 22 as an energy source that is capable of disrupting the surface bonding. The "dangling bonds" that are generated by the disruptive light 24 (or other energy source), react with the oxygen-containing reagent (and/or its products), to remove the resist in the regions 20 that are not crosslinked. The crosslinking serves as an etch mask and the resultant pattern in this embodiment is negative tone. Again, since such low-energy processing may exhibit excellent etch rate selectivity between the crosslinked regions and the uncrosslinked regions, acceptable CD control and uniformity of the feature may be achieved and vertical sidewalls, for crisp image transfer into the underlying film, may be generated.

The resists which may be used for the embodiments described above are numerous. The choice is limited only by the energy source 22 used and the embodiment selected. In the case of the first embodiment the crosslinked regions 18 are etched, therefore the resist 12 used serves as a diffusion barrier and does not need to be resistant to etching. This allows for very low energy sources 22 to be used, dependent on the choice of resist and material diffused into the resist. In the second embodiment, the crosslinked regions 18 serve as an etch mask and must therefore be more resistant to etching. As an example, an acrylic-based resist may be used, which when crosslinked becomes very hard and resistant to etching. Dyes may be incorporated into the resist to limit the depth of the conversion caused by the crosslinking and still avoid depth of field problems even with a relatively intense exposure. Preferably the dye is a photon absorbing dye. The strength and intensity of the energy source chosen directly affects the degree of resistance to etching required in the crosslinked regions 18 of the resist 12.

These embodiments take advantage of surface-imaging by crosslinking the surface of the resist 12 in the regions 18 exposed, for example, by a UV optical imaging tool. The depth of the crosslinking is not expected to be more than several thousand angstroms and could, as an example be in the vicinity of 100Å. These embodiments also take advantage of dry development, to produce high image contrast vertical sidewalls for good CD control and uniformity, and to generate an etch resist feature that will accommodate good image transfer into the underlying film.

This single-layer process does not suffer from the process complexity of multi-layered techniques or sensitivity to process variations with reagent diffusion profiles, as is the case with prior art surface imaging processes. Moreover, it is simpler in process and chemistry than standard lithography techniques, since it does not need a sensitizer incorporated into the resist. As a result of the high etch rate selectivity, this process is not afflicted with poor contrast resulting from poor selectivity.

A preferred embodiment has been described in detail hereinabove. It is to be understood that the scope of the invention also comprehends embodiments different from those described, yet within the scope of the claims. For example, the energy sources used to expose and develop the resist may be many things, such as ions, electrons or photons. Similarly, the oxygen-containing reagent used in the develop step may be replaced with, for example, hydrogen or a hydrogen liberating source such as ammonia. The diffused reagent ambient, in the first preferred embodiment, is described as a silicon containing ambient but may be other materials such as a titanium containing ambient. The crosslinking may be replaced by any method that will modify the resist material in a manner such that the desired etch and/or diffusion properties are achieved. Words of inclusion are to be interpreted as nonexhaustive in considering the scope of the invention.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming patterned features, said method comprising:
    a. forming a layer of resist on a substrate, said layer having a thickness;
    b. patterning said resist by selective exposure to a first energy source to modify the developing properties of portions of said resist, leaving an amount of said thickness unexposed; and
    c. developing said resist wherein said developing is done with a second energy source and a developing reagent which comprises hydrogen.

2. The method of claim 1, wherein said first source is ultraviolet light.

3. The method of claim 1, wherein said resist comprises acrylic.

4. The method of claim 1, wherein a dye is incorporated into said resist to prevent exposure of said amount of said thickness to be left unexposed.

5. The method of claim 1, wherein said patterning step occurs in an oxygen-free environment.

6. The method of claim 5, wherein a nitrogen purge is used to create said oxygen-free environment.

7. The method of claim 1, wherein said substrate has multiple layers.

8. The method of claim 1, wherein a diffusion reagent is diffused into unmodified regions of said resist before said developing step.

9. A method for forming patterned features said method comprising:
   a. forming a layer of resist on a substrate, said layer having a thickness;
   b. patterning said resist by selective exposure to a first energy source to crosslink portions of said resist leaving an amount of said thickness unexposed;
   c. diffusing a diffusion reagent into crosslinked regions of said resist; and
   d. developing said resist wherein said developing is done with a second energy source and a developing reagent which comprises hydrogen.

10. The method of claim 9, wherein said diffusion reagent contains silicon.

11. The method of claim 9, wherein said diffusion reagent contains titanium.

12. The method of claim 9, wherein said substrate has multiple layers.

13. The method of claim 9, wherein said first and second energy sources are both ultraviolet light.

14. The method of claim 9, wherein said resist comprises acrylic.

15. The method of claim 9, wherein a dye is incorporated into said resist to prevent exposure of said amount of said thickness to be left exposed.

16. The method of claim 9, wherein said patterning step occurs in an oxygen-free environment.

17. The method of claim 9, wherein a nitrogen purge is used to create said oxygen-free environment.

18. The method of claim 1, wherein said second energy source is ultraviolet light.

19. The method of claim 1, wherein said resist does not contain an added sensitizer that facilitates or inhibits etching once exposed to said first energy source.

20. The method of claim 9, wherein said resist does not contain an added sensitizer that facilitates or inhibits etching once exposed to said first energy source.

* * * * *